United States Patent [19]

Ebihara et al.

[11] 4,237,420
[45] Dec. 2, 1980

[54] TEMPERATURE SENSING CIRCUIT

[75] Inventors: Heihachiro Ebihara; Fukuo Sekiya; Misao Uchino, all of Tokorozawa, Japan

[73] Assignee: Citizen Watch Company Limited, Tokyo, Japan

[21] Appl. No.: 952,513

[22] Filed: Oct. 18, 1978

[30] Foreign Application Priority Data

Oct. 25, 1977 [JP] Japan .................................. 52-129930

[51] Int. Cl.$^3$ ..................... H03K 3/284; G05D 23/20
[52] U.S. Cl. ........................................ 328/3; 307/310; 307/273; 328/207
[58] Field of Search .................... 307/310, 273; 328/3, 328/207

[56] References Cited

U.S. PATENT DOCUMENTS

| 3,544,910 | 12/1970 | Ralphs | 307/273 |
| 3,576,496 | 4/1971 | Garagnon | 307/273 |
| 3,761,743 | 9/1973 | Barber | 328/207 |
| 3,820,029 | 6/1974 | McKinley | 328/207 |

Primary Examiner—Stanley D. Miller, Jr.
Assistant Examiner—B. P. Davis
Attorney, Agent, or Firm—Jordan and Hamburg

[57] ABSTRACT

A circuit for producing a digital output varying linearly with temperature changes by measuring the width of a pulse from a monostable multivibrator, in which the pulse is measured more than twice in succession and the results added. A greater change in the digital output for a given temperature change is achieved, providing higher measurement accuracy.

3 Claims, 6 Drawing Figures

|    | $B_7$ | $B_6$ | $B_5$ | $B_4$ | $B_3$ | $B_2$ | $B_1$ | $B_0$ |     |
|----|-------|-------|-------|-------|-------|-------|-------|-------|-----|
| OD | 0 | 1 | 0 | 0 | 0 | 0 | 0 | 0 | aa |
|    | 0 | 1 | 0 | 0 | 0 | 0 | 1 | 1 | bb |
| ND | 1 | 0 | 0 | 0 | 0 | 0 | 0 | 0 | cc |
|    | 1 | 0 | 0 | 0 | 0 | 1 | 1 | 0 | dd |

TEMPERATURE SENSING CIRCUIT

The present invention relates to a circuit for measuring temperature changes by means of an monostable multivibrator having a time constant element such as a resistor or capacitor which has a linear response to temperature variations. Increased accuracy by comparison with circuits of this type is achieved by measuring the pulse width of the monostable multivibrator twice in succession and adding together the results obtained, to produce a digital output signal.

In various types of electronic devices, such as electronic timepieces etc., it is desirable to incorporate a circuit which will produce an output signal that is proportional to changes in the ambient temperature of the electronic device. To facilitate utilization of this signal for control and display purposes, it is also desirable that it should be in digital form. One conventional type of circuit for this purpose utilizes a monostable multivibrator in which one or more of the elements determining the time constant of the multivibrator has a linear variation in its electrical properties (such as capacitance or resistance) with variation of temperature. However, the temperature coefficient of such an element is usually quite small. Thus, the amount of variation of the digital output signal obtained for a given variation in the ambient temperature will also be small, so that only a limited accuracy of temperature display or temperature control can be achieved.

With a temperature sensing circuit in accordance with the present invention, this disadvantage of the conventional type of circuit is substantially reduced. This is achieved by measuring the pulse width of a temperature sensor monostable multivibrator twoce in succession, and adding together the results obtained. Thus, for a given change in temperature, the amount of variation of the output digital signal is twice as great as in the case of a temperature sensing circuit of conventional type.

It is therefore an object of the present invention to produce a temperature sensing circuit of improved form, having a digital information output.

Further objects, features and advantages of the present invention will be made more apparent from the following description, when taken in conjunction with the attached drawings, whose scope is given by the appended claims.

Figure 1:
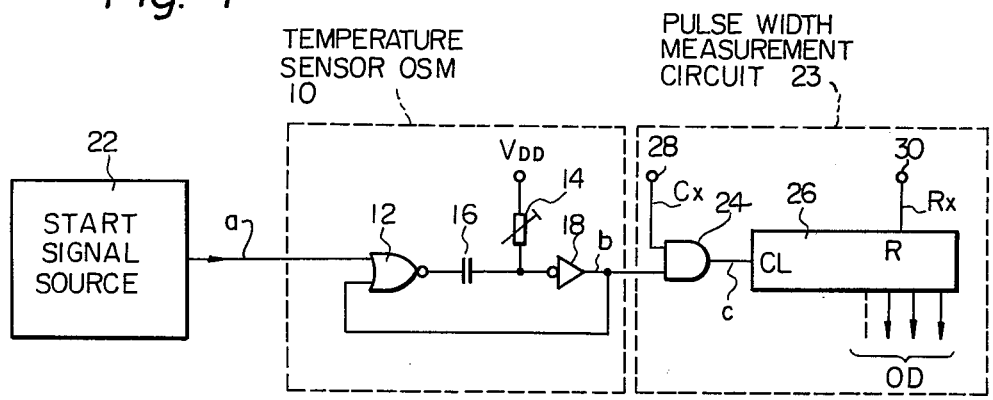
FIG. 1 is a circuit diagram of a temperature sensing circuit of conventional type, having a digital form of output signal.
Figure 2:
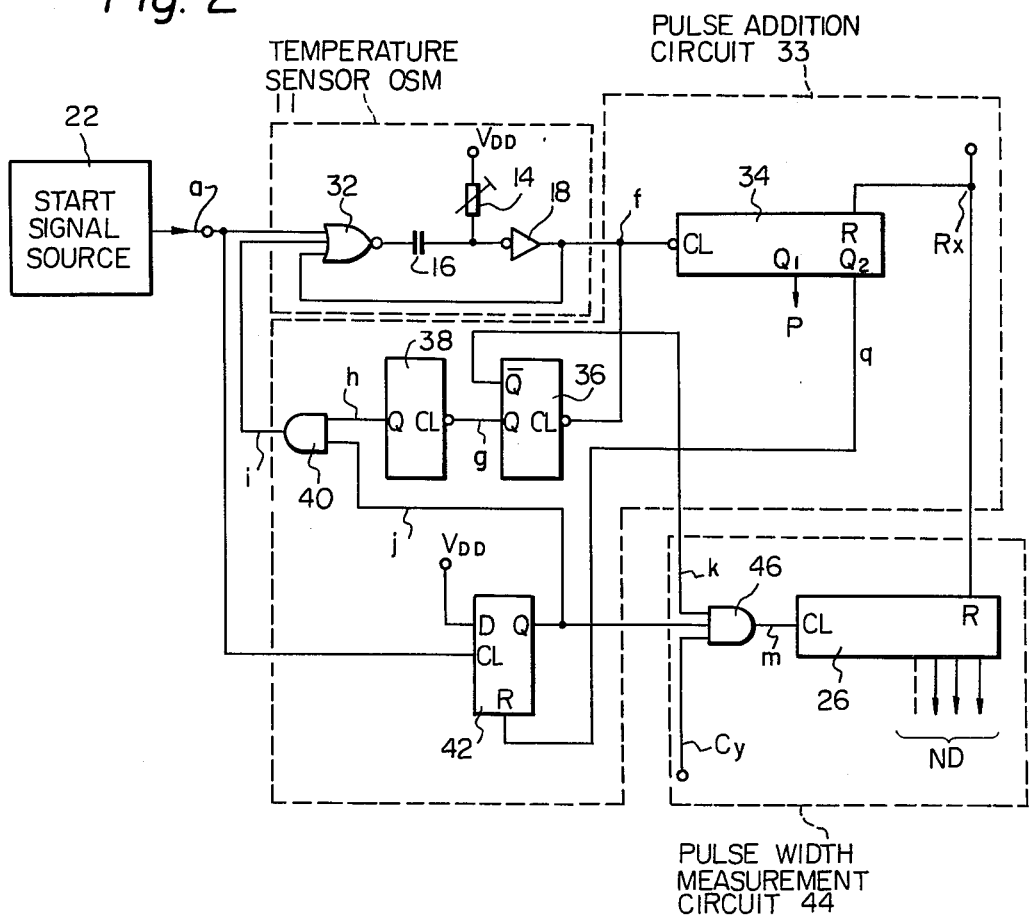
FIG. 2 is a circuit diagram of an embodiment of a temperature sensing circuit in accordance with the present invention.
Figures 5, 6:
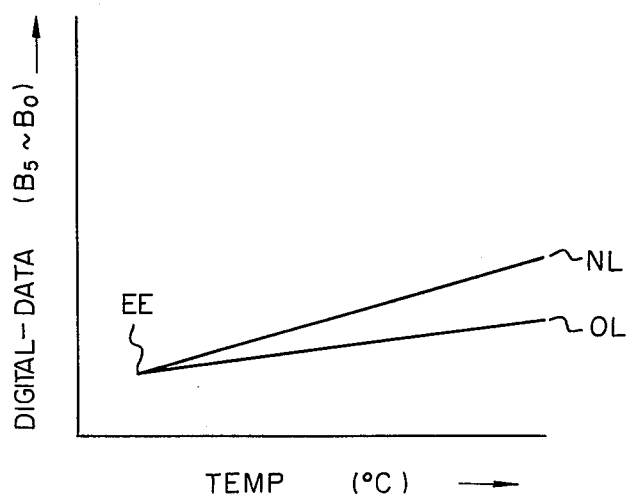

FIG. 5 is an output state chart showing the variation with temperature of the output of the sensing circuit of conventional type shown in FIG. 1 and of the output of the embodiment of the present invention shown in FIG. 2; and FIG. 6 is a graph showing the variation of the digital output signals of the temperature sensing circuit of conventional type shown in FIG. 1 and of the embodiment of the present invention shown in FIG. 2, with variation of temperature.

Figure 3:
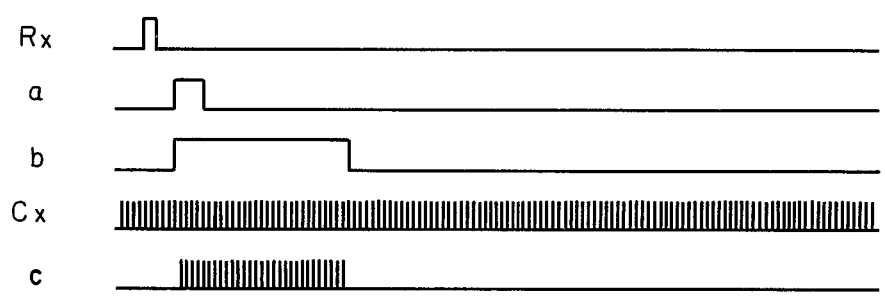
FIG. 3 is a waveform diagram for the sensing circuit of FIG. 1.

The operation of a temperature sensing circuit of conventional type employing a monostable multivibrator (sometimes referred to as a one-shot multivibrator, and abbreviated hereinafter to OSM) will first be described with reference to FIG. 1 and FIG. 3. FIG. 1 is a circuit diagram of such a conventional type of temperature sensing circuit. Numeral 10 indicates a temperature sensor circuit utilizing an OSM as a temperature sensor. The OSM consists of a two-input NOR gate 12, the output of which is connected to one terminal of a capacitor 16. One end of an adjustable resistor 14 is connected to one side of a power source, designated as Vdd, while the other terminal of resistor 14 is connected to the other terminal of capacitor 16 and to the input terminal of an inverter 18. The output of inverter 18 is connected back to one input of NOR gate 12, and to one input terminal of AND gate 24 of a pulse width measurement circuit 23. The other input terminal of two-input AND gate 24 is connected to a source of clock pulses Cx. The output of AND gate 24 is applied to the clock terminal of a counter circuit 26. Counter circuit 26 is reset by a signal Rx applied to its reset terminal prior to a temperature sensing operation being initiated. The count held in counter 26 is output in digital form, as output OD.

The operation of this circuit will now be described. To begin a temperature sensing operation, counter 26 is first reset by pulse Rx, as shown in FIG. 3. A start pulse a is then applied from a source of start pulses 22. This can consist of a switch which is actuated by an operator when it is desired to perform temperature sensing, or can be part of the timekeeping circuits of an electronic timepiece which periodically produces a start signal a in order to provide a periodic readout of temperature or to obtain a temperature proportional signal for timekeeping correction purposes. Prior to start signal a being applied, the junction of resistor 14 and capacitor 16 is at the high potential of the power source (referred to hereinafter as the H level), due to capacitor 16 being charged through resistor 14. The output of inverter 18 is therefore at the low potential of the power source (referred to hereinafter as the L level). When start pulse a is applied to NOR gate 12, the output of NOR gate 12 goes instantaneously to the L level, so that the output of inverter 18 goes to the H level. Capacitor 16 will then begin to be charged by a charging current applied through resistor 14. When capacitor 16 becomes charged to a voltage level greater than the input threshold level of inverter 18, then the output of NOR gate 12 will again fall to the L level. Thus, a pulse is produced after start pulse a is applied, whose duration is determined by the values of capacitor 16 and resistor 14, either or both of which varies linearly with temperature. The output pulse from temperature sensor circuit 10, pulse b, is applied to AND gate 24 of pulse width measurement circuit 23. While pulse b is being applied, clock pulses Cx are gated through AND gate 24, and are counted by counter 26. The number of pulses counted by counter 26 will obviously be proportional to the duration of pulse b, i.e. a variation in the duration of pulse b caused by a variation of temperature will cause a proportional variation in the number of pulses stored in counter circuit 26 (designated as n in FIG. 3). The count is output in digital form, as outputs OD.

This circuit has the disadvantage that, since the temperature coefficient of capacitor 16 or resistor 14 will be relatively small, the amount of change in output OD for a given change in temperature will be very small. Thus, the accuracy of temperature readout or temperature control which can be achieved by utilizing output OD is rather low.

FIG. 2 is a circuit diagram of an embodiment of a temperature sensing circuit in accordance with the present invention. Numeral 11 indicates a temperature sensor circuit utilizing an OSM, which operates in the same manner as temperature sensor circuit 10 in FIG. 1, but incorporates a three-input NOR gate 32, instead of the two-input NOR gate 12 of the circuit of FIG. 1. Numeral 33 indicates a pulse addition circuit, which is used to add together two successive pulses produced by temperature sensor circuit 11 in a manner to be described later. Pulse addition circuit 33 contains a counter circuit 34, the clock input terminal of which is connected to the output of temperature sensor circuit 11. The output of temperature sensor circuit 11 is also applied to the clock terminal (i.e. the trigger terminal) of an OSM 36. The Q output of OSM 36 is applied to the trigger terminal of another OSM 38, the Q output of which is connected to one input terminal of an AND gate 40. The $\overline{Q}$ output of OSM 36 is connected to one input terminal of an AND gate 46 in pulse width measurement circuit 44. Output Q2 of counter circuit 34 is connected to the reset terminal of a data type flip-flop 42, the clock terminal of which receives start signal a from start signal source 22. The Q output of data-type flip-flop 42 is connected to the remaining input of AND gate 40, and to one of the input terminals of three-input AND gate 46 of pulse width measurement circuit 44.

Figure 4:
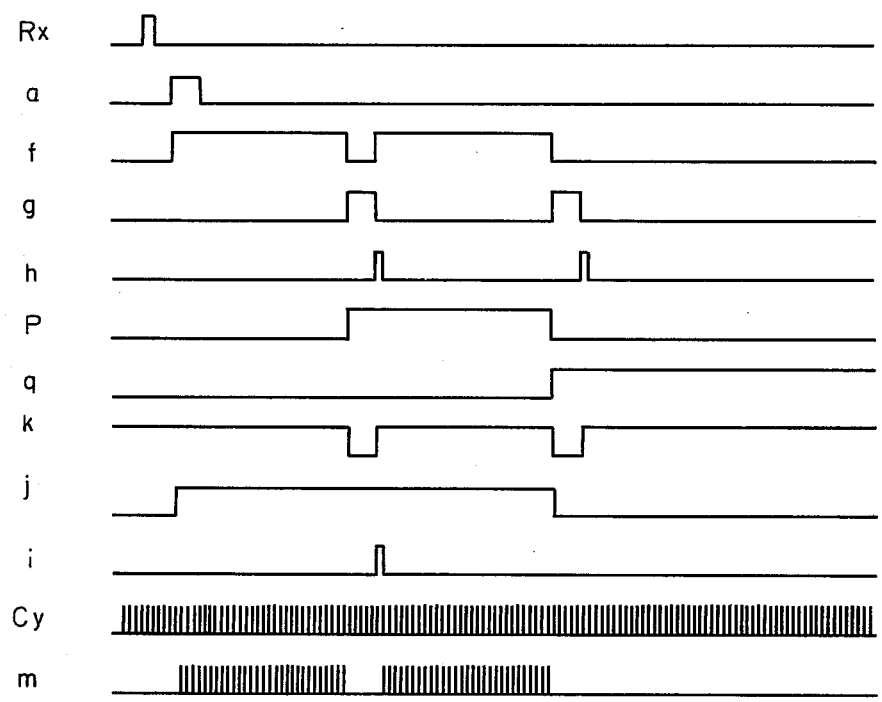
FIG. 4 is a waveform diagram for the sensing circuit of FIG. 2.

The operation of this circuit will now be described, with reference to FIG. 2 and to the waveform diagrams of FIG. 4. First, before the start of a temperature sensing operation, a reset pulse Rx is applied to the reset terminals of counters 34 and 26. A start signal a is then applied to three-input NOR gate 32 and to the clock terminal of data-type flip-flop 42. The junction of resistor 14 and capacitor 16 then falls from the H level to the L level, causing an H level pulse f to be produced by temperature sensor circuit 11 and applied to the clock terminal of counter circuit 34 and OSM 36. When the output of temperature sensor circuit 11 goes from the H level to the L level, then output P of counter 34 goes from the L level to the H level. (Output P of counter 34 is shown only for the purpose of illustrating the operation of counter 34, and is not utilized in the circuit of FIG. 2). The H level to L level transition of the output of temperature sensor circuit 11 also causes an output pulse to be produced by OSM 36, as indicated by the letter g in FIGS. 2 and 4. When this pulse g goes from the H level to the L level, OSM 38 is triggered to produce pulse h. Meanwhile, when start pulse a is applied, the Q output of data-type flip-flop 42 goes from the L level to the H level, and remains there (indicated by the letter j). Thus, pulse h from OSM 38 is output from AND gate 40, as pulse i, and is input to NOR gate 32. Pulse i acts as a retrigger pulse, and has the same effect as applying another start pulse to temperature sensor circuit 11. Thus the OSM of temperature sensor circuit 11 is retriggered to produce a second pulse, as shown by waveform f in FIG. 4. When the output of temperature sensor 11 again goes from the H level to the L level, then output p of counter circuit 34 goes from the H level to the L level, while output g goes from the L level to the H level. Data-type flip-flop 42 is thereby reset, so that its Q output goes to the L level. Thus, although output pulses g and h are again produced by OSM 36 and OSM 38, these have no effect, since AND gate 40 is inhibited when the output of data-type flip-flop 42 goes to the L level. It will be apparent that clock pulses Cy are applied to the clock terminal of counter circuit 26 only while both the $\overline{Q}$ output of OSM 36 and the Q output of data-type flip-flop 42 are at the H level simultaneously. This is identical to the time during which the output of temperature sensor circuit 11 is at the H level. Thus, clock pulses Cy are gated into counter circuit 26 during two consecutive output pulses from temperature sensor circuit 11, as indicated by waveform m in FIG. 4.

FIG. 5 shows typical outputs from the conventional type of circuit shown in FIG. 1 (output OD) and for the embodiment of the present invention shown in FIG. 2 (output ND). B0 to B7 indicate the digits of the outputs, with B0 being the least significant digit and B7 being the most significant digit. Letters aa and cc indicate the outputs of the conventional circuit of FIG. 1 at a certain temperature, while cc indicate the output of the embodiment of FIG. 2 for the same temperature. If now the temperature increases, then the output of the conventional circuit of FIG. 1 will change to the value indicated by letters bb, while the output of the embodiment of the present invention shown in FIG. 2 will change to the value indicated by letters dd. Thus, if one considers the least significant six digits of the output, i.e. digits B0 to B5, there is twice as great a change in the output of the circuit according to the present invention, as compared to the conventional type of circuit shown in FIG. 1. This is shown graphically in FIG. 6, in which the values of the B0 to B5 outputs of the conventional circuit and of the circuit according to the present invention have the same value, EE, at some arbitrary temperature. When the temperature rises to a level at which the output from the conventional circuit has a value OL, then the output of the circuit according to the present invention has a value NL. It can be seen that the change in the value of the output is twice as great in the case of the circuit in accordance with the present invention.

From the above description, therefore, it will be apparent that a temperature sensing circuit in accordance with the present invention provides a greater degree of change in an output digital signal for a given change in temperature, as compared with a temperature sensing circuit of conventional type.

While the present invention has been shown and described with reference to a particular embodiment, it should be noted that various other changes and modifications may be made without departing from the scope of the present invention.

What is claimed is:

1. A temperature sensing circuit comprising:
   a temperature sensor multivibrator for producing output pulses having a pulse width that varies with temperature;
   a source of start pulses for triggering said temperature sensor multivibrator to produce a first output pulse after each of said start pulses;
   circuit means for producing a retrigger pulse to retrigger said temperature sensor multivibrator after each of said first output pulses has ended, to produce at least a single second output pulse consecutive with said first output pulse;
   pulse addition means for producing an output signal having a duration equal to the sum of the durations of said first and second output pulses from said temperature sensor multivibrator;

a source of clock pulses; and a pulse width measurement circuit responsive to said output signal from said pulse addition means for counting said clock pulses, to thereby produce a digital output signal whose value is proportional to the total duration of said first output pulse and said second output pulse consecutive with said first output pulse from said temperature sensor monostable multivibrator.

2. A temperature sensing circuit according to claim 1, in which said start pulses and said clock pulses are in an asynchronous relationship.

3. A temperature sensing circuit according to claim 1, in which said circuit means for producing a retrigger pulse comprises at least one monostable multivibrator having a trigger terminal coupled to an output of said temperature sensor circuit and gate means for coupling an output signal from said at least one monostable multivibrator to an input terminal of said temperature sensor monostable multivibrator.

* * * * *